United States Patent
Li et al.

(10) Patent No.: US 9,041,176 B2
(45) Date of Patent: May 26, 2015

(54) HYBRID SEMICONDUCTOR MODULE STRUCTURE

(71) Applicant: Qualcomm Incorporated, San Diego, CA (US)

(72) Inventors: Yue Li, San Diego, CA (US); Charles D. Paynter, Encinitas, CA (US); Ruey Kae Zang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 101 days.

(21) Appl. No.: 13/764,356

(22) Filed: Feb. 11, 2013

(65) Prior Publication Data

US 2014/0097512 A1    Apr. 10, 2014

Related U.S. Application Data

(60) Provisional application No. 61/711,195, filed on Oct. 8, 2012.

(51) Int. Cl.
| | |
|---|---|
| *H01L 23/02* | (2006.01) |
| *H01L 21/00* | (2006.01) |
| *H01L 21/82* | (2006.01) |
| *H01L 49/02* | (2006.01) |
| *H01L 25/065* | (2006.01) |

(52) U.S. Cl.
CPC ............... *H01L 21/82* (2013.01); *H01L 28/00* (2013.01); *H01L 25/065* (2013.01); *H01L 2224/16225* (2013.01); *H01L 2225/1023* (2013.01); *H01L 2225/1058* (2013.01); *H01L 2924/15321* (2013.01); *H01L 2924/15331* (2013.01); *H01L 2924/19105* (2013.01)

(58) Field of Classification Search
USPC .......... 257/723, 724, 528, 777; 438/107, 109; 247/685, 686, E25.006, E25.021, 247/E25.027, E23.085
See application file for complete search history.

(56) References Cited

U.S. PATENT DOCUMENTS

| | | | |
|---|---|---|---|
| 7,119,801 B1 | 10/2006 | Endo et al. | |
| 7,427,535 B2 * | 9/2008 | Vaiyapuri | ...................... 438/109 |
| 7,746,656 B2 | 6/2010 | Shim et al. | |
| 7,986,033 B2 | 7/2011 | Barth | |
| 8,148,806 B2 | 4/2012 | Lin et al. | |
| 8,163,600 B2 * | 4/2012 | Chow et al. | ................... 438/109 |
| 2007/0053167 A1 | 3/2007 | Ueda | |

* cited by examiner

*Primary Examiner* — Jasmine Clark
(74) *Attorney, Agent, or Firm* — Michelle S. Gallardo

(57) ABSTRACT

Some implementations provide a structure that includes a first package substrate, a first component, a second package substrate, a second component, and a third component. The first package substrate has a first area. The first component has a first height and is positioned on the first area. The second package substrate is coupled to the first package substrate. The second package substrate has second and third areas. The second area of the second package substrate vertically overlaps with the first area of the first package substrate The third area of the second package substrate is non-overlapping with the first area of the first package substrate. The second component has a second height and is positioned on the second area. The third component is positioned on the third area. The third component has a third height that is greater than each of the first and second heights.

30 Claims, 15 Drawing Sheets

Front View

Side View

HYBRID SEMICONDUCTOR MODULE STRUCTURE

RELATED APPLICATION

This application claims the priority benefit of U.S. Provisional Ser. No. 61/711,195, filed Oct. 8, 2012.

BACKGROUND

1. Field

Various features relate to a hybrid semiconductor module structure, and more specifically to an efficient arrangement of components of different heights within a semiconductor package.

2. Background

There is a constant need to reduce the size of semiconductor packages and modules. FIG. 1 illustrates an example of a semiconductor package 100 and a module 102 found in the prior art. The package 100 includes a first package substrate 104, a set of solder balls 106a-b, and several components 108a-f. The components 108a-f are positioned on the package substrate 104. The package 100 also includes a second package substrate 110, a set of solder balls 112a-b and an integrated circuit die 114. The components 108a-f and the integrated circuit die 114 have relatively the same height, which makes it possible to position them on the first package substrate 104 and the second package substrate 110.

As further shown in FIG. 1, the module 102 includes a package substrate 116, a first component 118, an integrated circuit die 120 and a second component 122. As shown in FIG. 1, the second component 122 is substantially taller than the first component 118 and the integrated circuit 120. Moreover, the second component 122 is also substantially taller than the components 108a-f and the integrated circuit die 114 of the package 100. Because of the size and height of the second component 122, coupling the module 102 and the package 100 is difficult. Moreover, doing so would create a relatively large and/or tall module structure. In addition, the combination of the package 100 and the module 102 would create a lot of empty and unused space between the package 100 and the module 102. For example, the space directly above the first component 118 and the integrated circuit die 120 would be empty when the package 100 and the module 102 are combined.

Therefore, there is need for an improved semiconductor module structure that takes less space and utilizes the available space in the module structure more efficiently.

SUMMARY

Various features, apparatus and methods described herein provide a hybrid semiconductor module.

A first example provides a structure that includes a first package substrate, a first component, a second package substrate, a second component, and a third component. The first package substrate has a first area. The first component is positioned on the first area of the first package substrate. The first component has a first height. The second package substrate is coupled to the first package substrate. The second package substrate has a second area and a third area. The second area of the second package substrate vertically overlaps with the first area of the first package substrate. The third area of the second package substrate is non-overlapping with the first area of the first package substrate. The second component is positioned on the second area of the second package substrate. The second component has a second height. The third component is positioned on the third area of the second package substrate. The third component has a third height that is greater than each of the first and second heights.

According to one aspect, the first package substrate further includes a fourth area, where the fourth area of the first package substrate is non-overlapping with the second and third areas of the second package substrate. The structure further includes a printed circuit board (PCB) and a fourth component on the PCB. The fourth component has a fourth height. The second package substrate is coupled to the PCB such that the fourth component vertically overlaps with the fourth area of the first package substrate. In some implementations, the first package substrate is positioned on top of the second package substrate.

According to an aspect, at least one of the first, second and third components is an active functional component that perform operations. In some implementations, at least one of the first, second and third components is a passive functional component that provides a function that is more than providing an electrical path.

According to one aspect, at least one of the first, second and third components is one of at least a die, a capacitor, an inductor, a resistor, a fuse and/or a filter.

A second example provides a method for manufacturing a structure. The method provides a first package substrate that has a first area and a first component positioned on the first area of the first package substrate. The first component has a first height. The method provides a second package substrate that has a second area, a third area, a second component and a third component. The second component is positioned on the second area of the second package substrate. The second component has a second height. The third component is positioned on the third area of the second package substrate. The third component has a third height that is greater than each of the first and second heights. The method couples the first package substrate to the second package substrate such that (i) the second area of the second package substrate vertically overlaps with the first area of the first package, and (ii) the third area of the second package substrate is non-overlapping with the first area of the first package substrate.

According to one aspect, the method further provides a printed circuit board (PCB) that has a fourth component. The fourth component has a fourth height. The method also couples the second package substrate to the PCB, such that a fourth area of the first package substrate vertically overlaps with the fourth component on the PCB, but is free of vertical overlap with the second package substrate.

According to an aspect, at least one of the first, second and third components is an active functional component that perform operations. In some implementations, at least one of the first, second and third components is a passive functional component that provides a function that is more than providing an electrical path.

According to one aspect, at least one of the first, second and third components is one of at least a die, a capacitor, an inductor, a resistor, a fuse and/or a filter.

A third example provides an apparatus for manufacturing a structure. The apparatus includes means for providing a first package substrate that has a first area and a first component positioned on the first area of the first package substrate. The first component has a first height. The apparatus includes means for providing a second package substrate that has a second area, a third area, a second component and a third component. The second component is positioned on the second area of the second package substrate. The second component has a second height. The third component is positioned on the third area of the second package substrate. The third component has a third height that is greater than each of the first and second heights. The apparatus includes means for coupling the first package substrate to the second package substrate such that (i) the second area of the second package substrate vertically overlaps with the first area of the first package, and (ii) the third area of the second package substrate is non-overlapping with the first area of the first package substrate.

According to one aspect, the apparatus further includes means for providing a printed circuit board (PCB) that has a fourth component. The fourth component has a fourth height. The apparatus also includes means for coupling the second package substrate to the PCB, such that a fourth area of the first package substrate vertically overlaps with the fourth component on the PCB, but is free of vertical overlap with the second package substrate.

According to an aspect, at least one of the first, second and third components is an active functional component that perform operations. In sonic implementations, at least one of the first, second and third components is a passive functional component that provides a function that is more than providing an electrical path.

According to one aspect, at least one of the first, second and third components is one of at least a die, a capacitor, an inductor, a resistor, a fuse and/or a filter.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may be shown in detail in order not to obscure the embodiments.

Overview

Some implementations of the disclosure provide a structure that includes a first package substrate, a first component, a second package substrate, a second component, and a third component. The first package substrate has a first area. The first component is positioned on the first area of the first package substrate. The first component has a first height. The second package substrate is couplet, to the first package substrate. The second package substrate has a second area and a third area. The second area of the second package substrate vertically overlaps with the first area of the first package substrate. The third area of the second package substrate is non-overlapping with the first area of the first package substrate. The second component is positioned on the second area of the second package substrate. The second component has a second height. The third component is positioned on the third area of the second package substrate. The third component has a third height that is greater than each of the first and second heights. One or more of the components may be a functional component.

In some implementations, the first package substrate further includes a fourth area. The second package substrate is coupled to a printed circuit board (PCB) that includes a fourth component. The first package substrate is coupled to the PCB through the second package substrate such that the fourth area vertically overlaps with the fourth component on the PCB, but is otherwise free of vertical overlap with the second package substrate.

Exemplary Hybrid Semiconductor Module Structure

Figure 1:
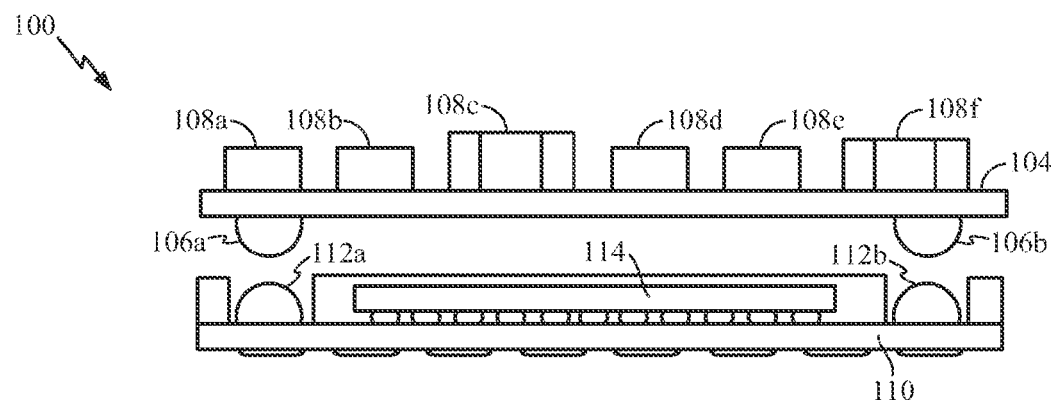
FIG. 1 illustrates a conceptual diagram of a semiconductor module in the prior art.
Figure 1:
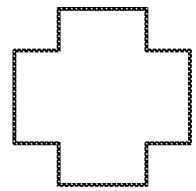
Figure 1:
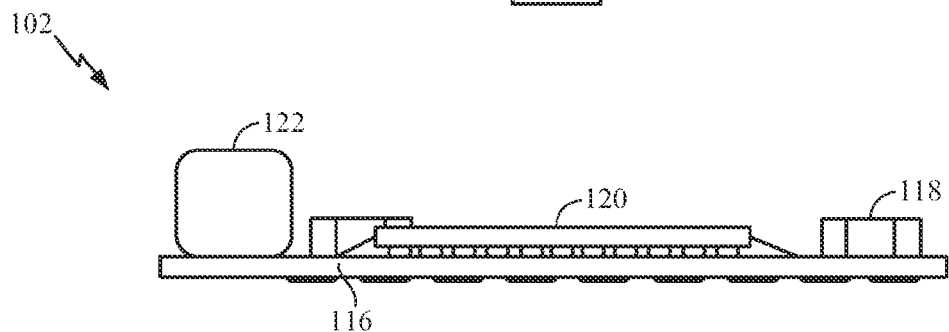
Figure 2:
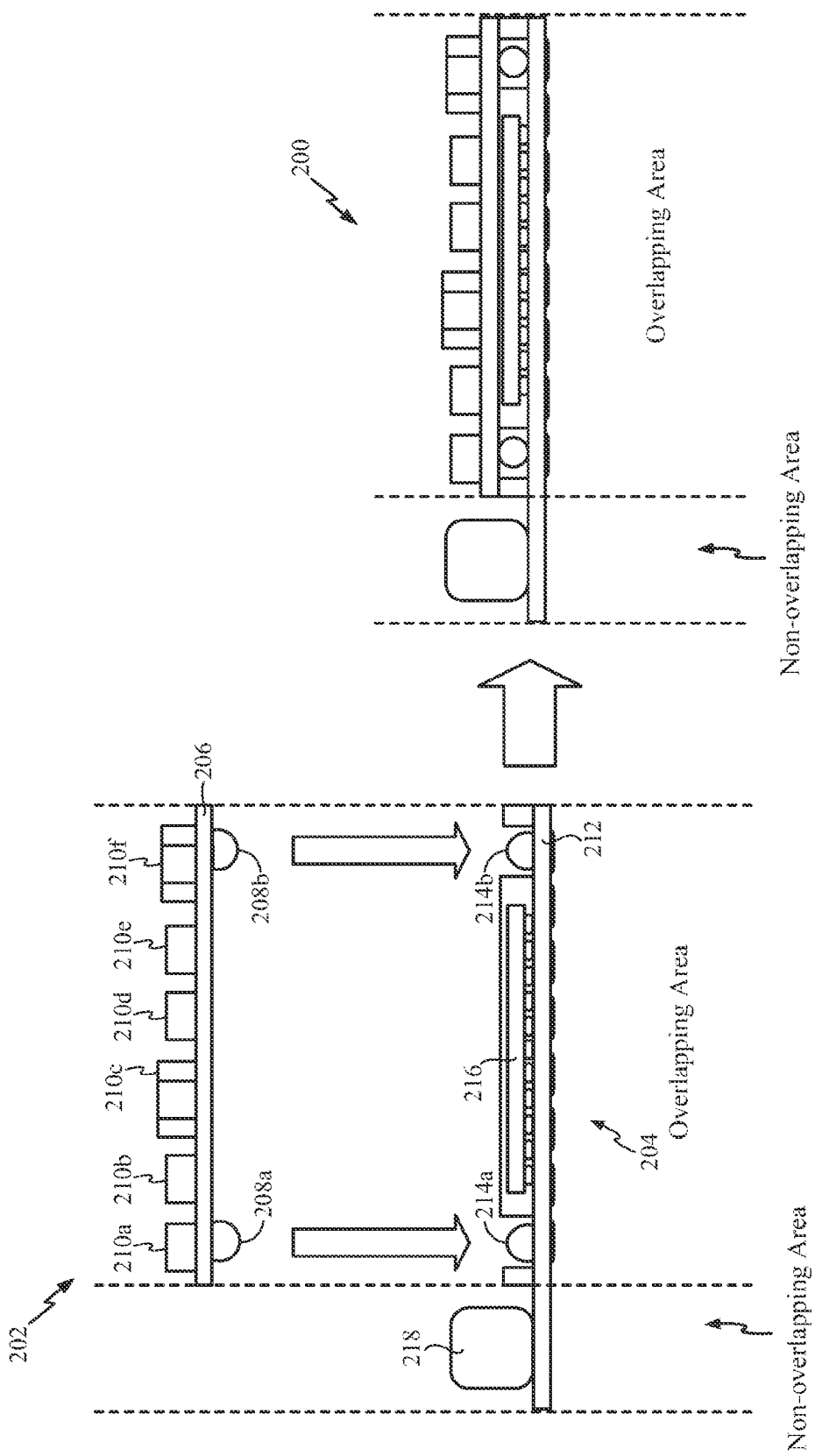
FIG. 2 illustrates a conceptual diagram of a hybrid semiconductor module structure.

FIG. 2 illustrates an example of how a hybrid semiconductor module structure 200 is assembled in some embodiments. As shown in FIG. 2, a hybrid semiconductor module structure 200 includes a package 202 and a module 204. The package 202 includes a package substrate 206, a set of solder balls 208a-b, and several functional components 210a-f. The functional components 210a-f are positioned on the package substrate 206. Each of the functional components 210a-f has a height (e.g., a first height or set of heights) that is less than or equal to a first height threshold value. Each of the components 210a-f is a functional component in that the components function more than to merely provide an electrical path. For example, one of the components may be an integrated circuit die or a passive component/device.

The term "functional component" is defined to include any component that may perform some sort of operation or functionality, whether by passive or active means, that is more than merely providing an electrical path. For example, a functional component may perform a logic operation. Examples of active or passive functional components include an integrated circuit (IC), a die, a capacitor, an inductor, a resistor, a filter and/or a fuse. A functional component is different than a connector (e.g., wire bond, solder, solder balls), which merely provides an electrical path. As such, a component of a package or module that merely provides an electrical path is not a functional component.

The module 204 includes a package substrate 212, a set of solder balls 214a-b, an integrated circuit (IC) die 216 and a functional component 218. As shown in FIG. 2, the package substrate 212 has two areas, an overlapping area (e.g., vertically overlapping area) and a non-overlapping area (e.g., vertically non-overlapping area). The overlapping area of the package substrate 212 is an area that overlaps (e,g., vertically) with an area of the package substrate 206 of the package 202 when the two structures (e.g., package 202 and module 204) are coupled together. The set of solder balls 214a-b and the integrated circuit die 216 are positioned in the overlapping area of the package substrate 212. The integrated circuit die 216 has a second height equal to or less than a second height threshold value).

The functional component 218 is positioned in the non-overlapping area of the package substrate 212. The functional component 218 has a height that is substantially greater than the integrated circuit die 216 and the functional components 210a-f. Thus, the functional component 218 has a third height that is greater than each of the first height and the second height. In some implementations, the functional component 218 may be any active or passive functional component such as a capacitor, an inductor a resistor, a fuse, a filter, or a die.

The package 202 is coupled to the module 204 via the set of solder balls 208a-b and the set of solder balls 214a-b. That is, the set of solder balls 208a-b of the package 202 are coupled to the set of solder balls 214a-b of the module 204, which therefore couples the package 202 to the module 204. However, a person of ordinary skill in the art may select any other type of known packaging interconnect, for example a copper pillar interconnect, to couple the package 202 to the module 204.

As shown in FIG. 2, the configuration and position of the various components creates a hybrid semiconductor module structure 200 that is smaller and/or thinner than a conventional package coupled to a module. This is achieved by moving components that are relatively taller than other components to an area of the package substrate that will not vertically overlap with another package substrate and/or components. Specifically, since the component 218 is substantially bigger and taller than all of the other components (e.g., component 210a, die 216) in the package substrates 206 and. 212, the component 218 is positioned in an area of the package substrate 212 that does not overlap with an area of the package substrate 206. In this way, the component 218 does not get in the way of the package substrate 206. Moreover, this configuration better utilizes the available space and reduces empty space in the structure. For example, this configuration substantially reduces the empty space directly above the integrated circuit die 216.

Another benefit of the configuration shown in FIG. 2 is that it allows the use of bigger but cheaper components that are comparable to newer, smaller and more expensive components. The end result is a cheaper module structure that is comparable in size to other module structures that utilize the newer, smaller and more expensive components. Another benefit of this configuration is that it reduces the negative parasitic in the module.

Figure 3:
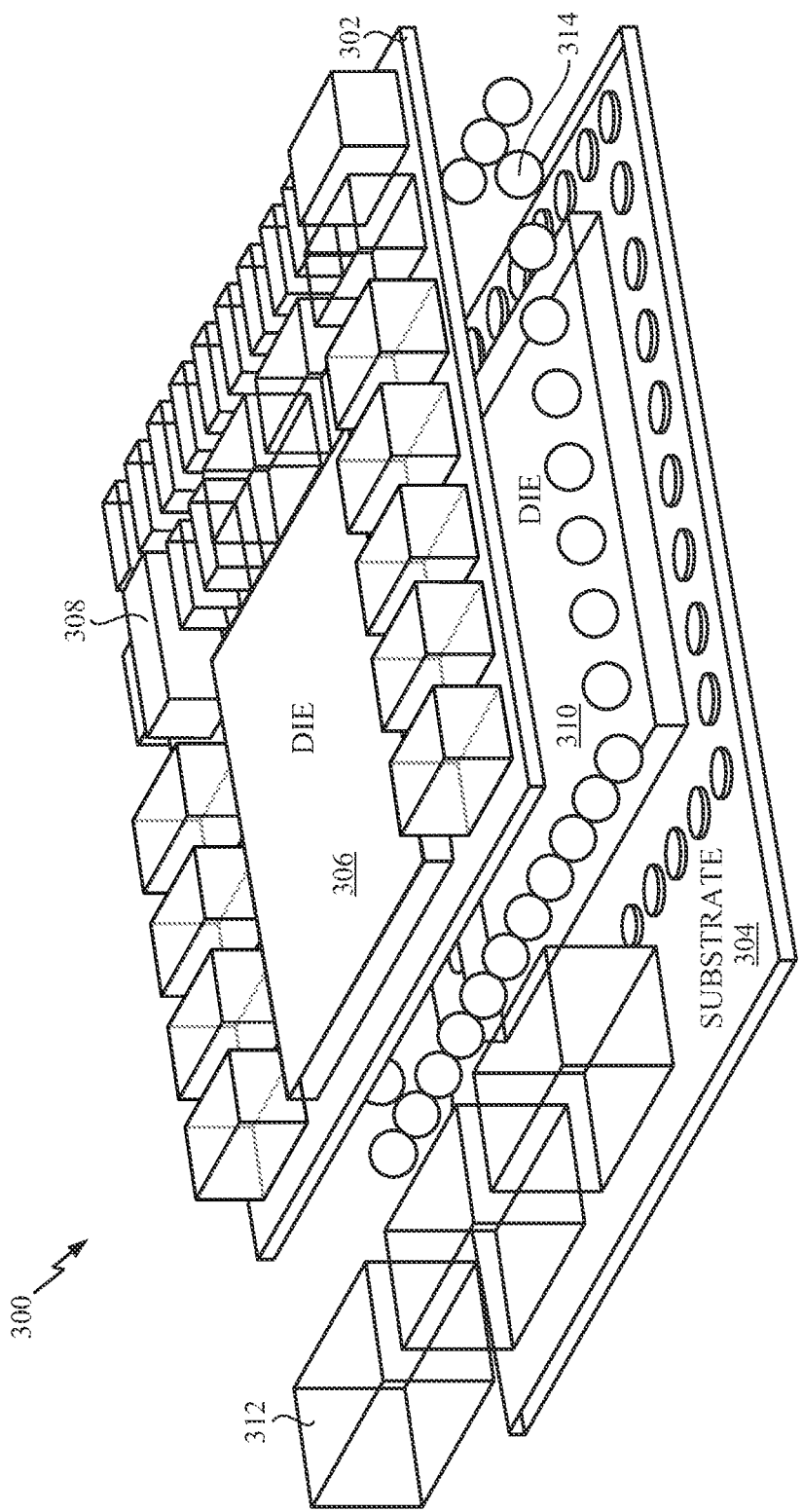
FIG. 3 illustrates a conceptual diagram of a hybrid semiconductor module structure.

FIG. 3 illustrates an angled view of a hybrid semiconductor module structure 300 with an exemplary breakdown of all the various parts. As shown in FIG. 3, the hybrid semiconductor module structure 300 includes a first substrate 302, a second substrate 304, a first die 306, a plurality of first functional components 308, a second die 310, a plurality of second functional components 312 and a plurality of solder balls 311.

The first die 306 and the plurality of first components 308 are positioned on the first substrate 302. The second die 310 and the plurality of second components 312 are positioned on the second substrate 304. The plurality of solder balls 311 is for coupling the first substrate 302 and the second substrate 304. However, any packaging interconnections (e.g., wire bonding, copper pillar interconnects) may be used in place of or in addition to the solder balls 314.

FIG. 3 also illustrates that the second die 310 is positioned in an area of the second substrate 304 that vertically overlaps with an area of the first substrate 302. FIG. 3 further illustrates that the plurality of the second components 312 are positioned in another area of the second substrate 301 that does not vertically overlap (e.g., free of vertical overlap) with any area of the first substrate 302. As shown in FIG. 3, the second components 312 are substantially bigger and taller than any of the other components (e.g., die 306, die 310, component 308), which is why they are located in an area of the substrate 304 that does not overlap (e.g., free of vertical overlap) with the substrate 302.

Figure 4:
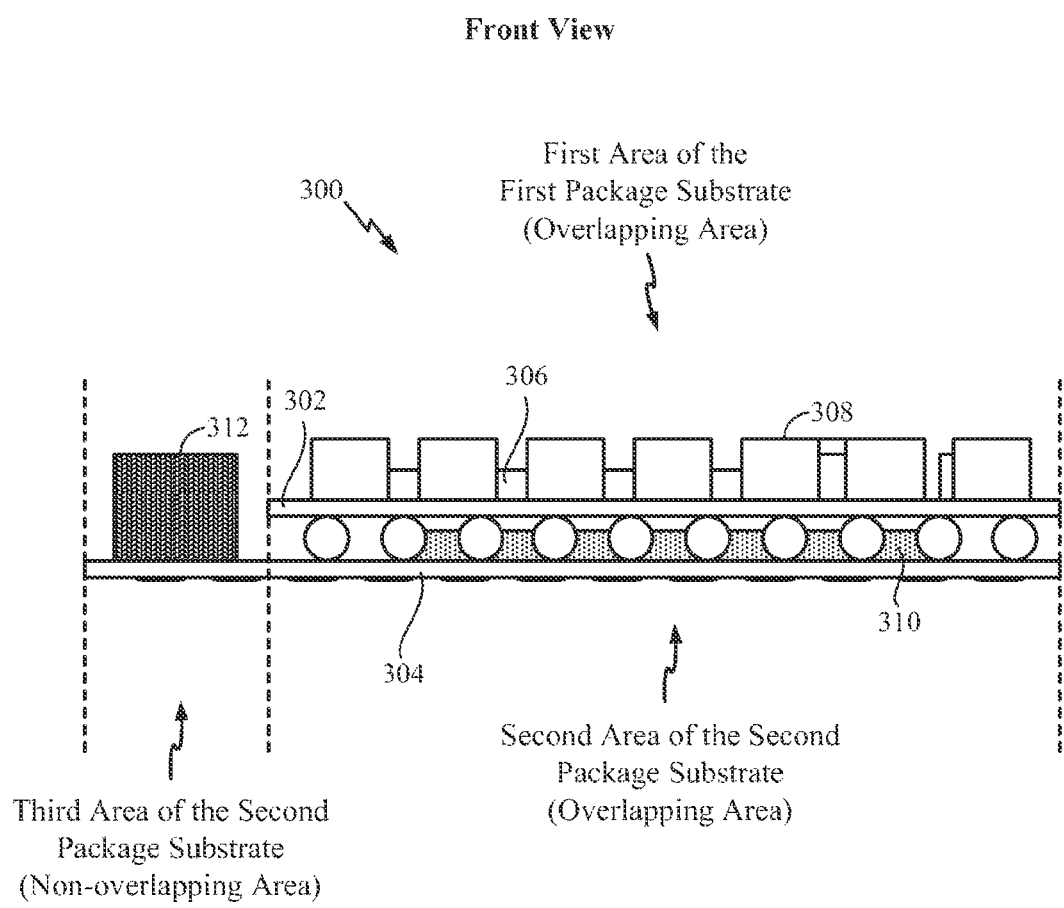
FIG. 4 illustrates a conceptual diagram of a front view of a hybrid semiconductor module structure.
Figure 5:
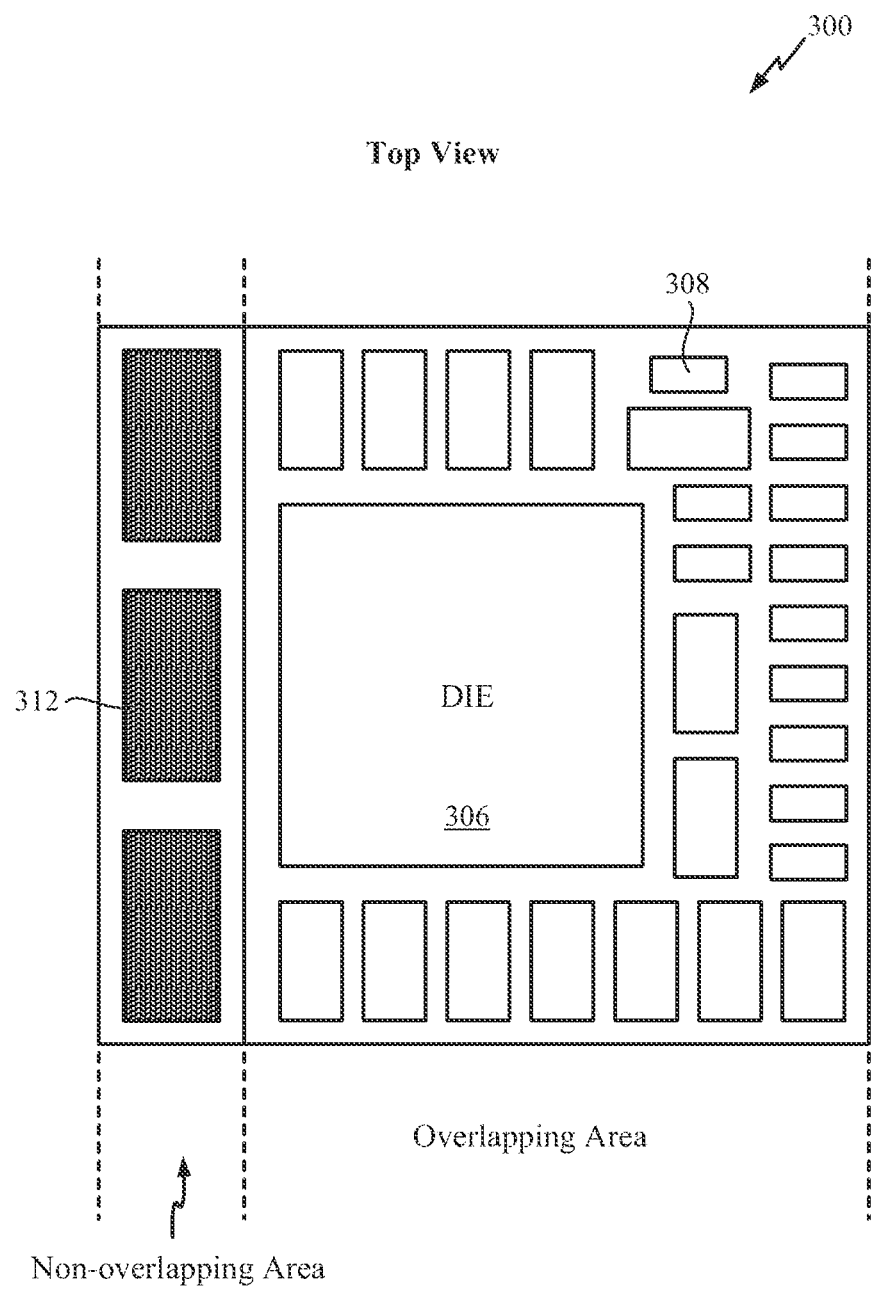
FIG. 5 illustrates a conceptual diagram of a top view of a hybrid semiconductor module structure.
Figure 6:
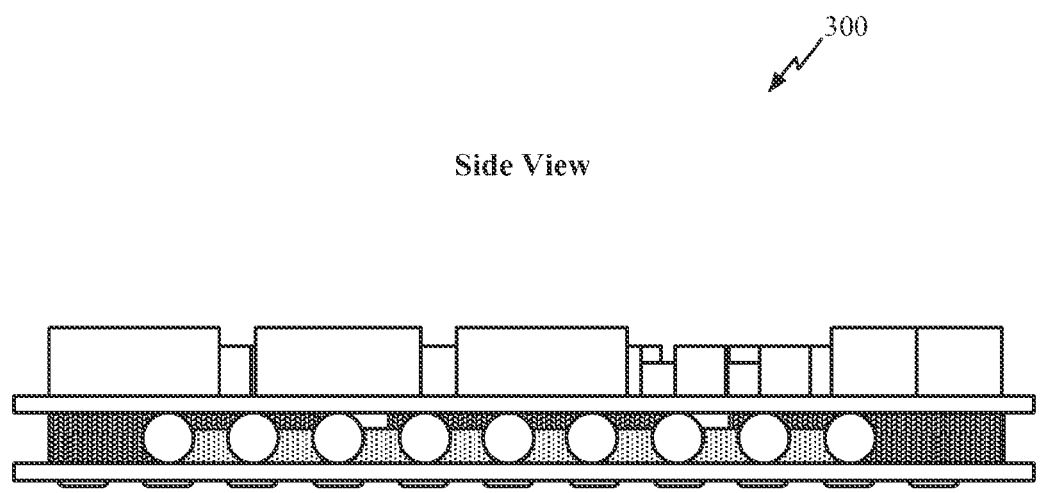
FIG. 6 illustrates a conceptual diagram of a side view of a hybrid semiconductor module structure.
Figure 7:
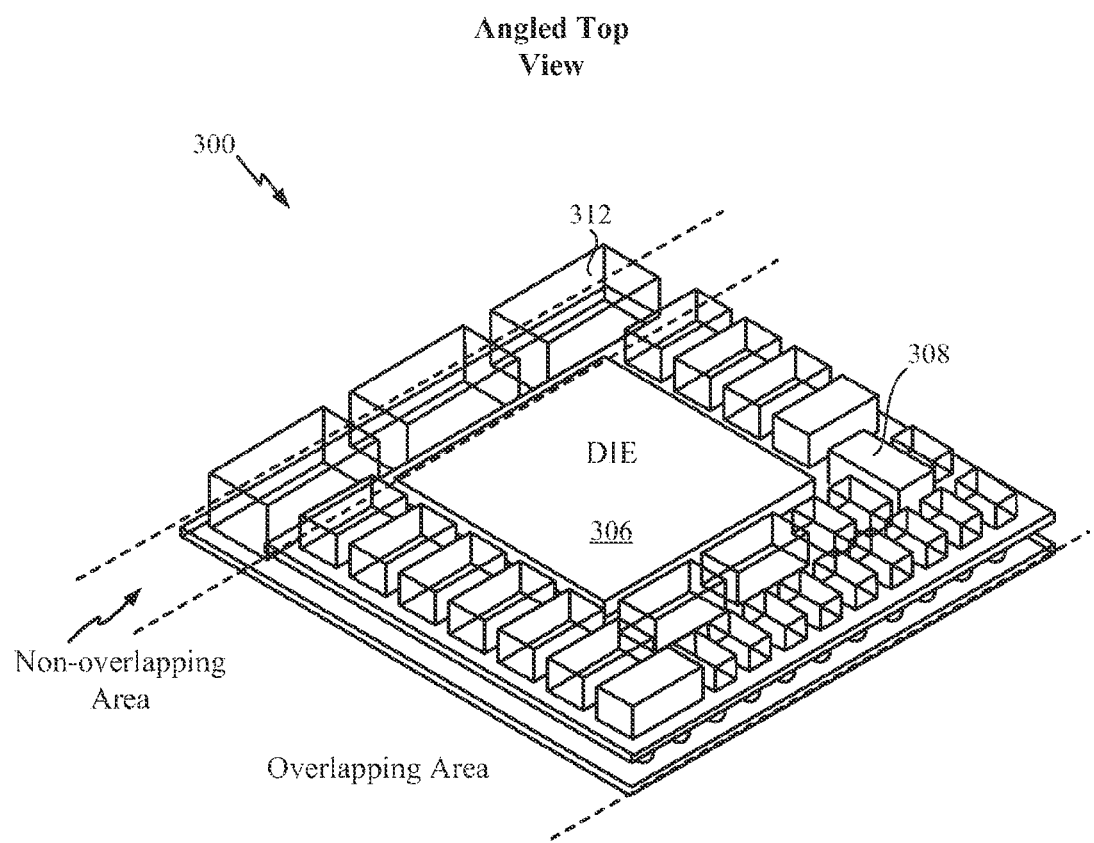
FIG. 7 illustrates a conceptual diagram of an angled top view of a hybrid semiconductor module structure.

FIGS. 4-7 illustrate the hybrid semiconductor module structure of FIG. 3 after assembly from various different views. FIG. 4 illustrates a front view of the hybrid semiconductor module structure 300 with the various areas of the packaging substrates identified. As shown in FIG. 4, the first package substrate 302 (e,g., top package substrate) includes a first area that vertically overlaps with a second area of the second package substrate 304 (e.g., bottom package substrate). The first area includes at least one first functional component (e.g., die 306, component 308). Each of the first functional components has a height (e.g., first height) that is less or equal to a first height threshold value. FIG. 4 also illustrates that the second package substrate 304 bottom package substrate) has a second area and a third area. The second area vertically overlaps with the first area of the first package substrate 302. The second area includes a second component (e.g., die 310) that has a height (e.g., second height) that is less than or equal to a second height threshold value. The third area of the second package substrate 304 is free of vertical overlap with the first package substrate 302 (e,g., free of vertical overlap with the first area of the first package substrate 302). The third area includes at least a third functional component 312 that has a height (e.g., third height) that is less than a third height threshold value, but greater than the heights of each of the first and second components (e.g., third height that is greater than each of the first and second heights).

FIGS. 2-7 illustrate a hybrid semiconductor module structure where the non-overlapping area is located to the side of the substrate. However, different implementations may have non-overlapping areas in different locations of the package substrate.

Figure 8:
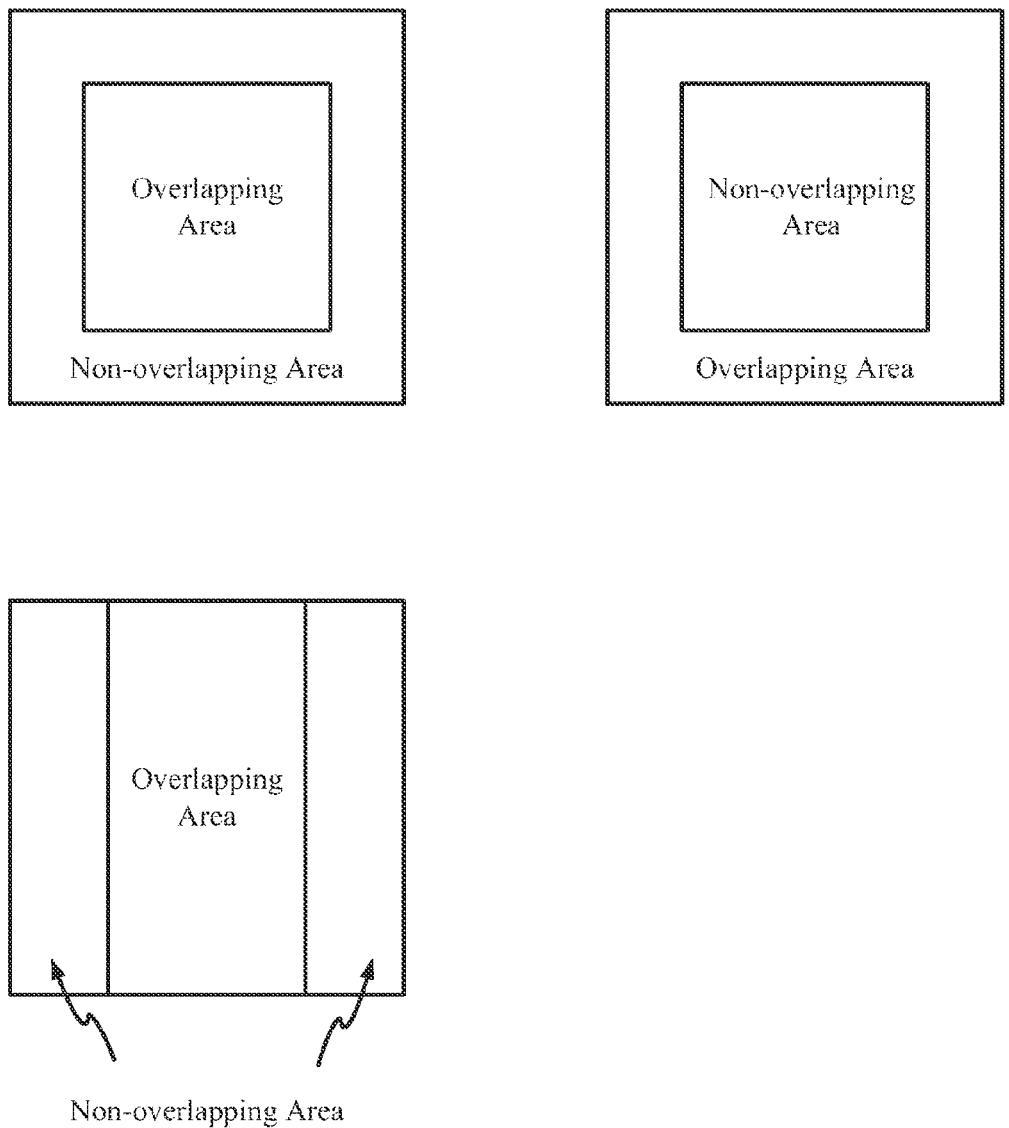
FIG. 8 illustrates other examples of overlapping and non-overlapping areas in a hybrid semiconductor module structure.

FIG. 8 illustrates different possible configurations of a hybrid semiconductor module structure with non-overlapping area in different portions of the substrate. As shown in FIG. 8, the Bon-overlapping area may be located in the perimeter of a substrate. Inversely, the non-overlapping area may be located in a center of the substrate.

Having described a hybrid semiconductor module structure, a method for providing/manufacturing a hybrid semiconductor module structure will now be described below.

Figure 9:
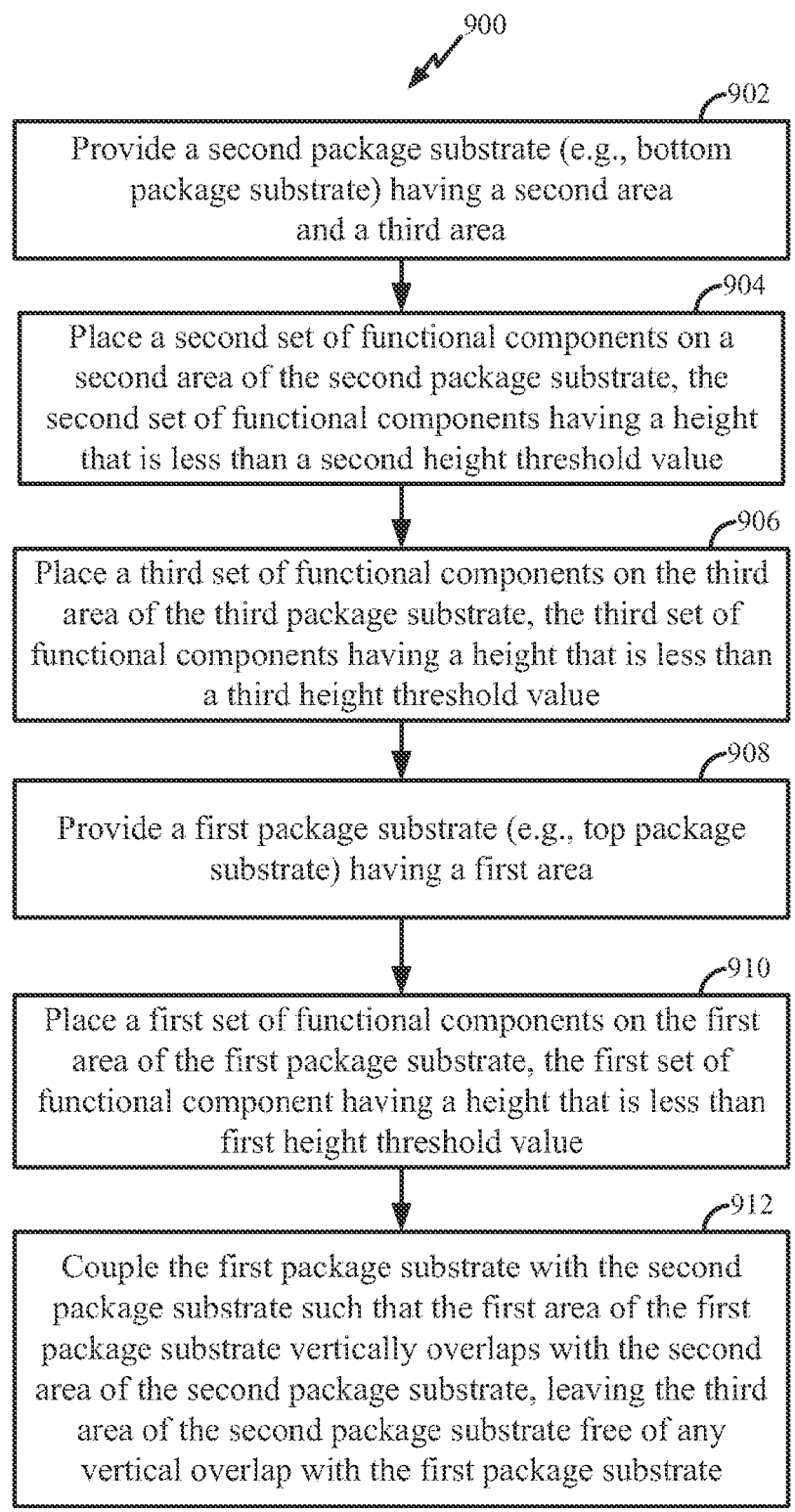
FIG. 9 illustrates a flow diagram of a process for providing/manufacturing a hybrid semiconductor module structure.

Exemplary Method for Providing/Manufacturing a Hybrid Semiconductor Module Structure FIG. 9 illustrates a flow diagram of a method 900 for providing/manufacturing a hybrid semiconductor module structure. More specifically, FIG. 9 illustrates a flow diagram for coupling a first package substrate (e.g., top package substrate) that has at least one first functional component to a second package substrate (e.g., bottom package substrate) that has at least one second functional component and one third functional component (e.g., coupling the first package substrate on top of the second package substrate). FIG. 9 will be described with reference to FIG. 10, which illustrates a sequence for providing/manufacturing a hybrid semiconductor module structure.

Figure 10:
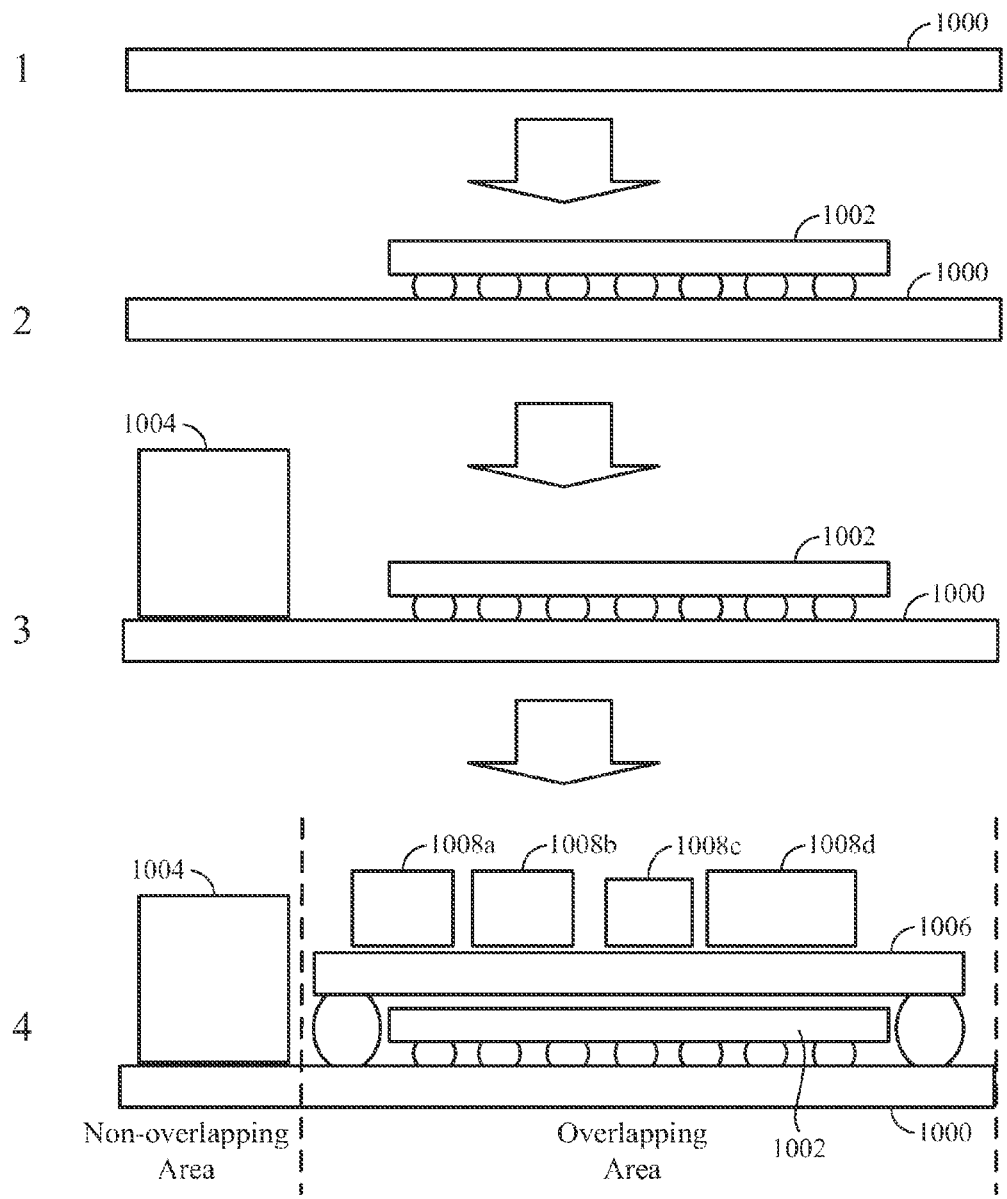
FIG. 10 illustrates a sequence of a process for providing/manufacturing a hybrid semiconductor module structure.

The method provides (at 902) a second package substrate (e.g., bottom package substrate) that has a second area and a third area. The first step of FIG. 10 illustrates a second package substrate 1000 (e.g., bottom package) being provided in some implementations. The second package substrate may be a semiconductor substrate that is coupled to a printed circuit board (PCB) in some implementations. After providing (at 902) the second package substrate, the method places (at 904) a second set of functional components on the second area of the second package substrate. The second area may be a second overlapping area of the second package substrate that vertically overlaps with a first package substrate in some implementations. The second set of functional components may be one component or several components. The functional components may be the same type of components or they may be different types of components. Each functional component from the second set of functional components has a height (e.g., second height or various different second heights) that is equal or less than a second height threshold value. The second set of functional components may include functional components (e.g., active or passive functional components), such as a capacitor, an inductor, a die, a resistor, a fuse, and a filter. The second step of FIG. 10 illustrates a die 1002 (which is an example of an active functional component) being placed (e.g., positioned) in a second area of the second package substrate 1000. The die 1002 is coupled to the package substrate 1000 via solder balls, however, any known type of interconnect may be selected by a person of ordinary skill in the art. For example, copper pillars or wire bonding may be used instead of solder balls in some implementations.

Next, the method places (at 906) a third set of functional components on the third area of the second package substrate. The third area may be a non-overlapping area of the second package substrate in some implementations. That is, the third area of the second package substrate may be an area of the second package substrate free of vertical overlap with the first package substrate when the first package substrate is coupled to the second package substrate in some implementations.

The third set of functional components may include one functional component or several functional components. The functional components may be the same type of components or they may be different types of components. Each functional component from the third set of functional components has a height (e.g., third height or various different third heights) that equal or less than a third height threshold value. Moreover, each component from the third set of functional components may have a height that is higher than the second height threshold value. The third set of functional components may include functional components (e.g., active or passive functional components), such as a capacitor, an inductor, a die, a resistor, a fuse, and a filter.

The third step of FIG. 10 illustrates a functional component 1004 (e,g., capacitor) that is placed (e.g., positioned) on a third area of the second package substrate 1000. As shown in the third step of FIG. 10, the functional component 1004 has a height that is higher than the first height threshold value the height of the die 1002, which is part of the second set of functional components).

The method further provides (at 908) a first package substrate (e.g., top package substrate) that has a first area. The first area may include the entire area of the first package substrate in some implementations. The first package substrate may be a semiconductor substrate (e.g., first package substrate 1006 of FIG. 10).

Next, the method places (at 910) a first set of functional components on the first area of the first package substrate. The first set of functional components may be one component or several components. The functional components may be the same type of components or they may be different types of components. Each functional component from the first set of functional components has a height (e.g., first height or various different first heights) that is less or equal to a first height threshold value. The first set of functional components may include an active functional component and/or a passive functional component, such as a capacitor, an inductor, a die, a resistor, a fuse, and a filter.

The method then couples (at 912) the first package substrate (e.g., top package substrate) having the first set of functional components to the second package substrate (e,g., bottom package substrate) having the second and third sets of functional components. In some implementations, the first package substrate is coupled to the second package substrate such that the first area of the first package substrate vertically overlaps with the second area of the second package substrate, leaving the third area of the second package substrate free of vertical overlap with the first package substrate (e.g., the third area is a non-overlapping area with the first package substrate).

The fourth step of FIG. 10 illustrates a first package substrate (e.g., top package substrate) coupled to a second package substrate (e.g., bottom package substrate). As shown in the fourth step of FIG. 10, a first package substrate 1006 that includes a first set of functional components 1008 is coupled to the second package substrate 1000. The first set of functional components 1008 is placed over a first area of the first package substrate 1006. The first set of functional components 1008 includes functional components 1008a-d. As shown in FIG. 10, the functional components 1008a-d may have different shapes and heights. However, the height of each functional component 1008a-d is less than a first height threshold value and less than a third height threshold value (e.g., less than the height of the functional component 1004) in sonic implementations.

As further shown in FIG. 10, the first set of functional components 1008 (e.g., components 1008a-d) on the first package substrate 1006, vertically overlaps with the second set of functional component (e.g., die 1002) on the second package substrate 1000. However, the first package substrate 1006 is coupled to the second package substrate 1000 so that the first package substrate 1006 and the first set of functional components 1008 do not vertically overlap with the third set of functional components (e,g., third functional component 1004). Thus, when the first package substrate 1006 is coupled to the second package substrate 1000, the first area of the first package substrate 1006 vertically overlaps with the second area of the second package substrate 1000, while leaving the third area (which includes a third component) of the second package substrate 1000 free of vertical overlap with the first package substrate 1006.

It should be noted that the positioning of the functional components on the substrate may include electrically coupling the functional components to the substrate. Different implementations may electrically couple the components to the substrate differently. Examples of methods of coupling components to a substrate include reflow bonding and thermal compression bonding.

Figure 11:
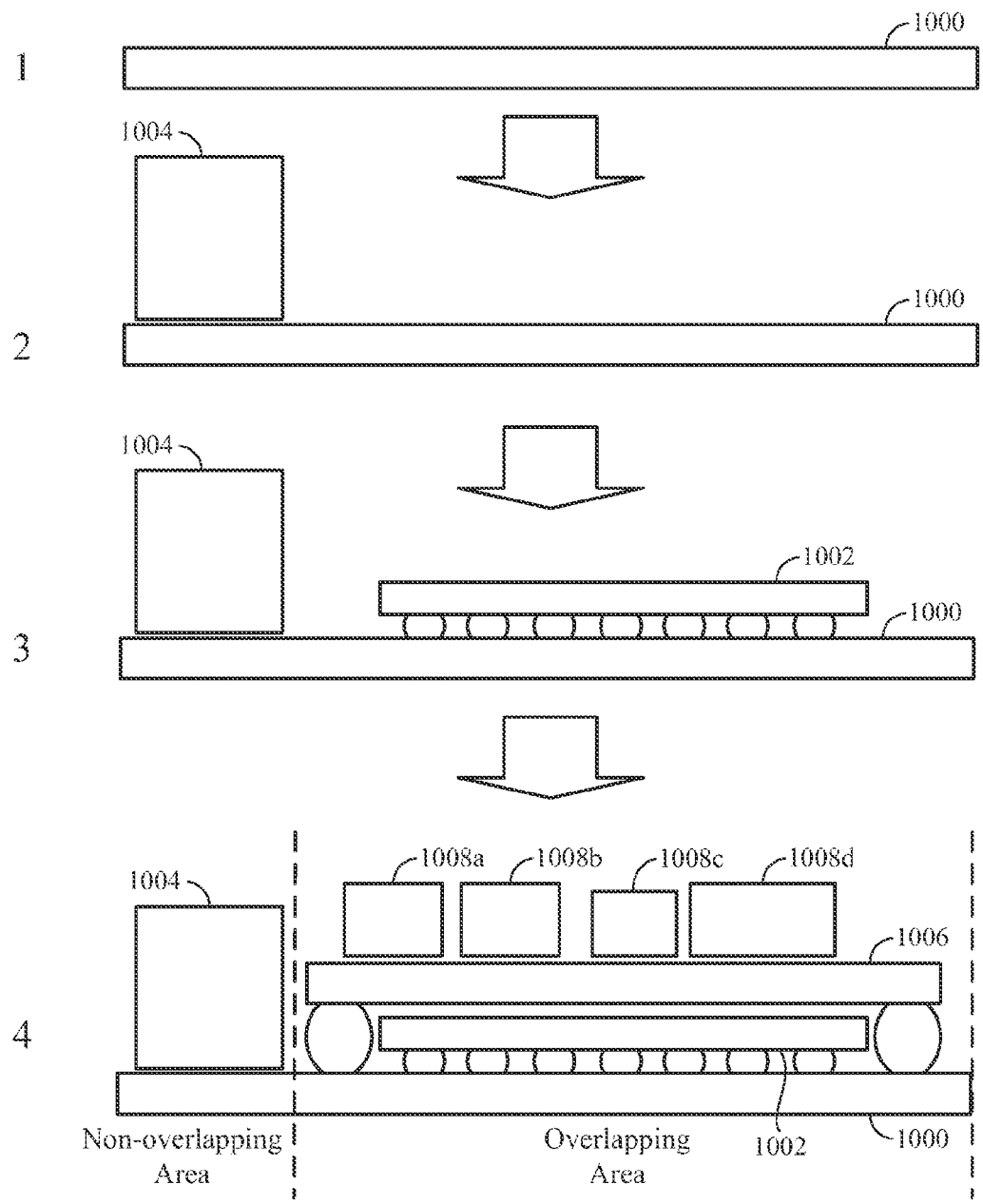
FIG. 11 illustrates another sequence of a process for providing/manufacturing a hybrid semiconductor module structure.

FIG. 11 illustrates another process for providing/manufacturing a hybrid semiconductor module structure. FIG. 11 is similar to FIG. 10, except that in FIG. 11, the functional component 1004 is positioned on the first package substrate 1000 before the die 1002. Thus, the order in which the first package substrate, the second package substrate, the first set of functional components, the second set of functional components, and the third set of functional components are provided and placed may be different in different implementations. Thus, nothing in the present disclosure shall limit the order in which substrates and functional components are coupled, provided and/or positioned.

In the above description, the height of the functional components is taken into account in order to determine where to place the functional component. In some implementations, the height of the substrate may also be taken into account when determining how to position functional components on a package substrate.

Exemplary Hybrid Semiconductor Module Structure Having Overhang

Figure 12:
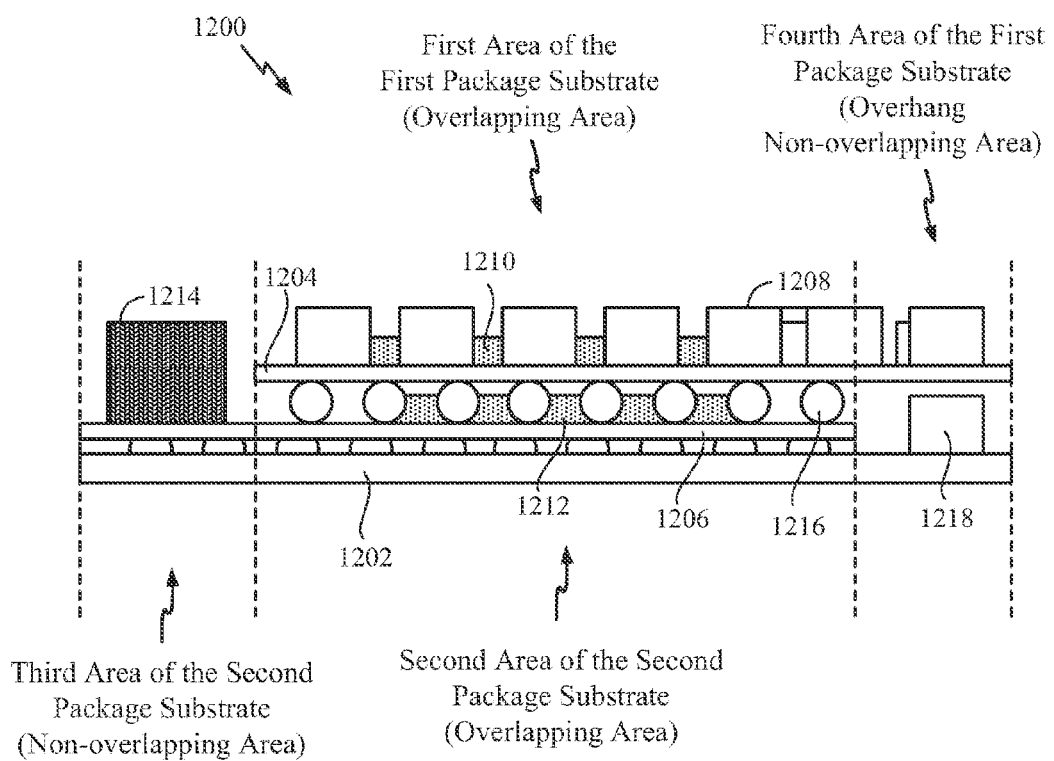
FIG. 12 illustrates a conceptual diagram of another hybrid semiconductor module structure.

FIG. 12 illustrates another example of a hybrid semiconductor module structure 1200 in some embodiments. Specifically, FIG. 12 illustrates a hybrid semiconductor module structure that has an overhang non-overlapping area in some implementations. As shown in FIG. 12, a hybrid semiconductor module structure 1200 includes a printed circuit board (PCB) 1202, a first package substrate 1204 (e.g., top package substrate) and a second package substrate 1206 (e.g., bottom package substrate). The PCB 1202 includes a fourth component 1218. The fourth component may be a functional component in some implementations.

The first package substrate 1204 has a first area and a fourth area. The first area may be an overlapping area that vertically overlaps with an area of the second package substrate 1206 (e.g., that overlaps with second area of the second package substrate when the first and second package substrates are coupled to each other). The fourth area may be an overhang non-overlapping area that is free of vertical overlap with the second package substrate 1206 when the first and second package substrates are coupled to each other. However, in some implementations, the fourth area (e.g., overhang area) of the first package substrate 1204 may vertically overlap with the fourth component 1218 on the PCB 1202 when the first and second package substrates 1201-1206 are coupled (directly or indirectly) with the PCB 1202.

The first package substrate 1204 (e.g., top package substrate) includes several first functional components (e.g., components 1208-1210). The first functional components may be in the first area and/or the fourth area of the first package substrate 1204. Each of the first functional components has a height (e.g., a first height or set of heights) that is less than or equal to a first height threshold value. Each of the first functional components is a functional component in that the components function more than to merely provide an electrical path. For example, one of the functional components may be an integrated circuit die or a passive component/device.

The second package substrate 1206 (e.g., bottom package substrate) includes several second functional components (e.g., components 1212-1214). As shown in FIG. 12, the second package substrate 1206 has two areas, namely, an overlapping area (e.g., vertically overlapping area) and a non-overlapping area (e.g., vertically non-overlapping area). The overlapping area of the second package substrate 1206 is an area that overlaps (e.g., vertically) with the first area of the package substrate 1204 when the package substrates 1204-1206 are coupled together. As shown in FIG. 12, the package substrates 1204-1206 are coupled together through a set of solder balls 1216, which are located in the overlapping area. However, a person of ordinary skill in the art may select any other type of known packaging interconnect, for example a copper pillar interconnect, to couple the first package substrate 1204 to the second package substrate 1206 As farther shown in FIG. 12, the functional component 1212 (e.g., die) is positioned in the second area (e.g., overlapping area) of the second package substrate 1206 and the functional component 1214 (e.g., capacitor) is positioned in the third area (e.g., non-overlapping area) of the second package substrate 1206. The functional component 1212 has a second height that is equal to or less than a second height threshold value. The functional component 1214 has a third height that is less than or equal to a third height threshold value. The third height is greater than the first and second heights in some implementations.

As further shown in FIG. 12, the configuration and position of the various components creates a hybrid semiconductor module structure 1200 that is smaller and./or thinner than a conventional package coupled to a module. This is achieved by moving components that are relatively taller than other components to an area of the package substrate that will not vertically overlap with another package substrate and/or components. Moreover, this configuration better utilizes the available space and reduces empty space in the structure. For example, this configuration substantially reduces the empty space directly above the functional component 1212.

Having described another implementation of hybrid semiconductor module structure, a method for providing/manufacturing such a hybrid semiconductor module structure will now be described below.

Figure 13:
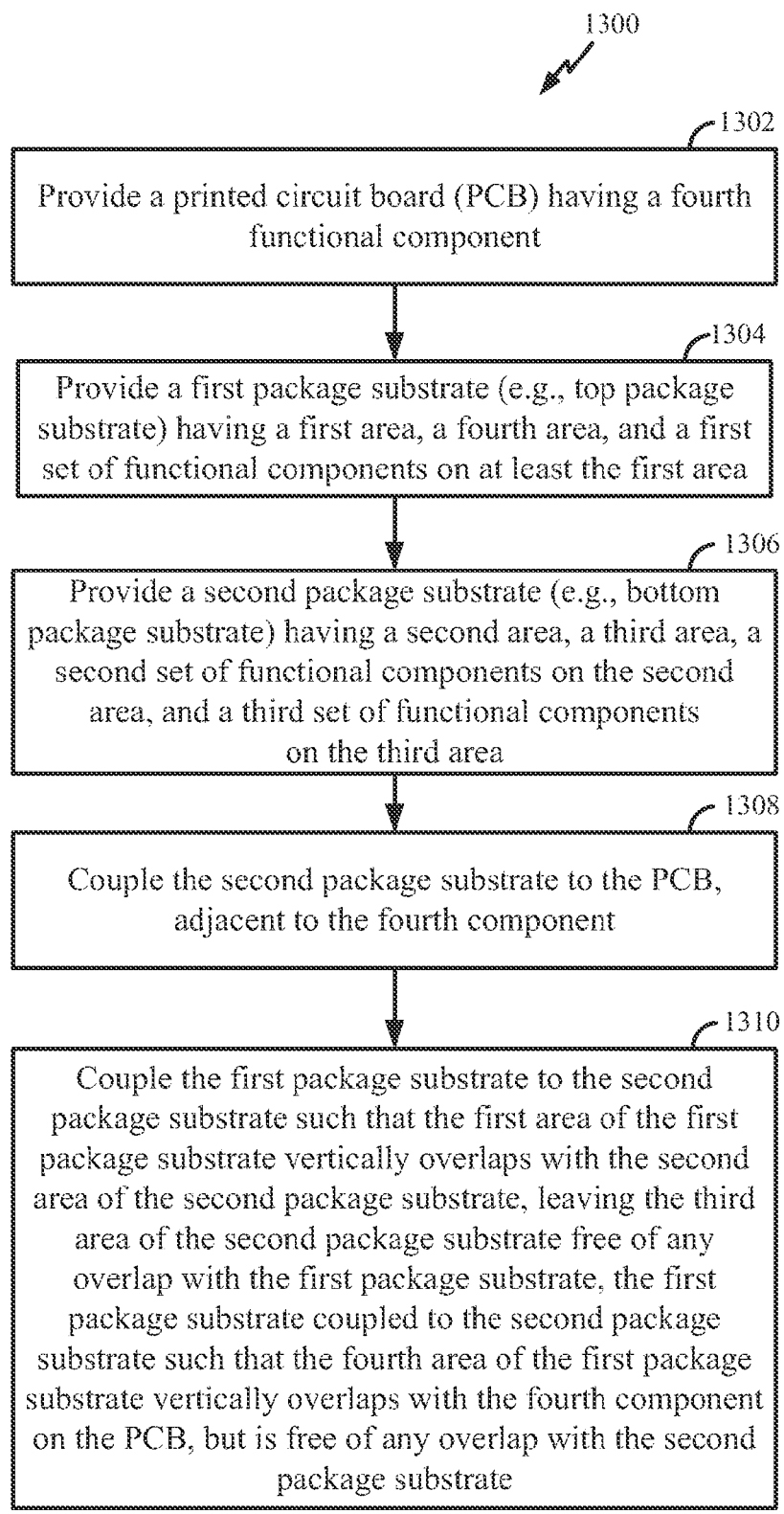
FIG. 13 illustrates a flow diagram of a process for providing/manufacturing another hybrid semiconductor module structure.

Exemplary Method for Providing/Manufacturing a Hybrid Semiconductor Module Structure Having an Overhang Area FIG. 13 illustrates a flow diagram of a method 1300 for providing/manufacturing a hybrid semiconductor module structure having an overhang area. More specifically, FIG. 13 illustrates a flow diagram for coupling a first package substrate (e.g., top package substrate) that has at least one first functional component, and a second package substrate (e.g., bottom package substrate) that has at least one second functional component and one third functional component, to a printed circuit board (PCB) that includes a fourth component. FIG. 13 will be described with reference to FIG. 14, which illustrates a sequence for providing/manufacturing a hybrid semiconductor module structure having an overhang area.

Figure 14:
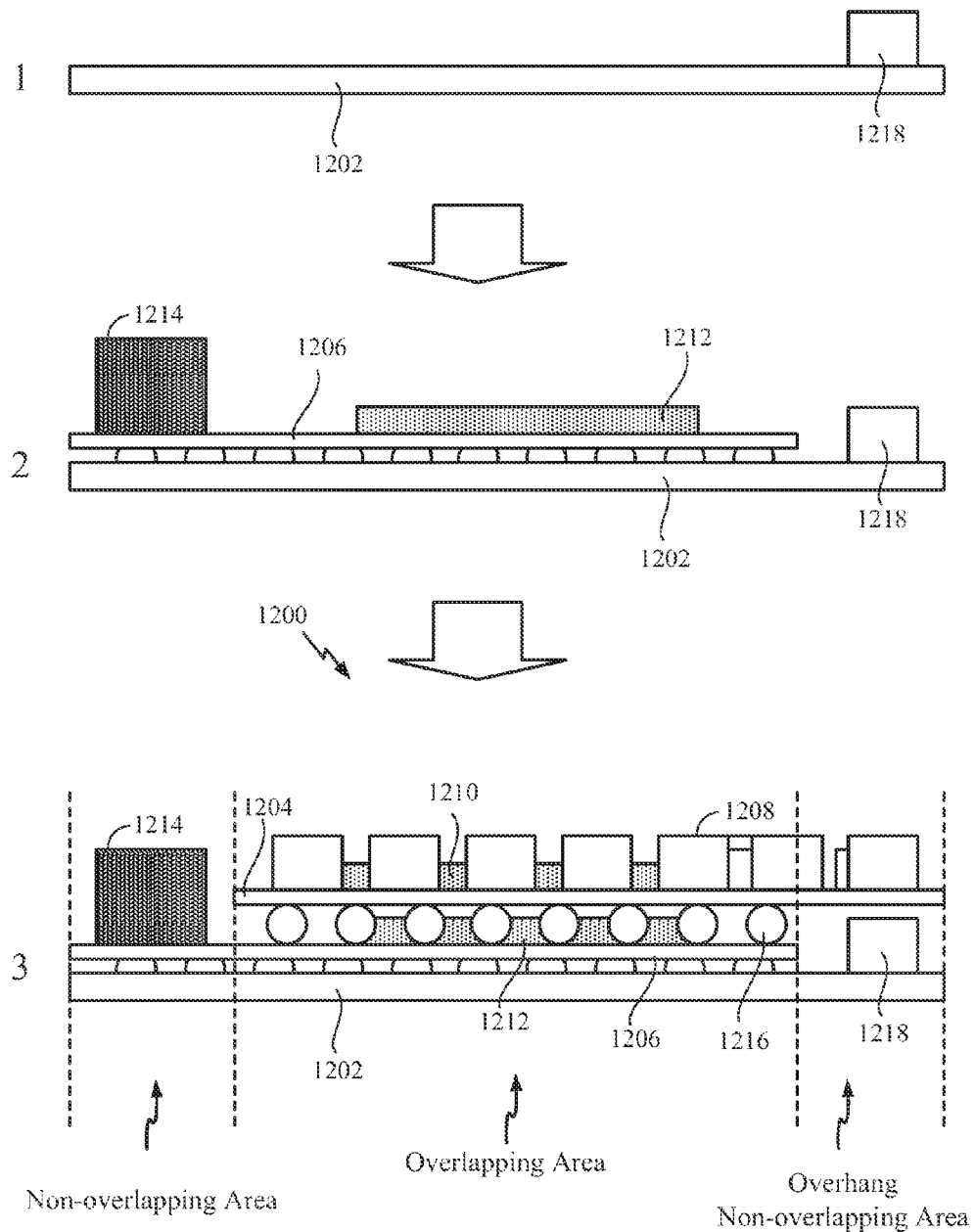
FIG. 14 illustrates a sequence of a process for providing manufacturing another hybrid semiconductor module structure.

The method provides (at 1302) a printed circuit board (PCB) that includes a fourth component. The fourth component may be a functional component. The first step of FIG. 14 illustrates a printed circuit board (PCB) 1202 that includes a fourth component 1218 being provided. The method further provides (at 1304) a first package substrate (e,g., top package substrate) that has a first area, a fourth area and a first set of functional components on at least the first area. The first and fourth areas may include the entire area of the first package substrate in some implementations. The first package substrate may be a semiconductor substrate (e.g., the first package substrate 1204 as shown in the third step of FIG. 14).

The first set of functional components may be one component or several components. The functional components may be the same type of components or they may be different types of components. Each functional component from the first set of functional components has a height (e.g., first height or various different first heights) that is less or equal to a first height threshold value. The first set of functional components may include an active functional component (e.g., die) and/or a passive functional component (e.g., capacitor). For example, the first set of functional components on the first package substrate may include functional component 1208 and die 1210 (as shown in FIG. 14).

The method further provides at 1306) a second package substrate (e.g., bottom package substrate) that has a second area and a third area. The second package substrate may be a semiconductor substrate in some implementations. The second area may be a second overlapping area of the second package substrate that vertically overlaps with the first area of the first package substrate when the first and second package substrates arc coupled together. In some implementations, the second area does not overlap with the fourth area of the first package substrate when the first and second package substrate are coupled together.

The third area may be a non-overlapping area of the second package substrate in some implementations. That is, the third area of the second package substrate may be an area of the second package substrate free of vertical overlap with the first package substrate when the first package substrate is coupled to the second package substrate in some implementations.

The second package substrate includes a second set of functional components on the second area of the second package substrate. The second set of functional components may be one component or several components. The functional components may he the same type of components or they may be different types of components. Each functional component from the second set of functional components has a height (e.g., second height or various different second heights) that is equal or less than a second height threshold value. The second set of functional components may include functional components (e.g., active or passive functional components), such as a capacitor, an inductor a die, a resistor, a fuse, and a filter.

The second package substrate includes a third set of functional components on the third area of the second package substrate. The third set of functional components may include one functional component or several functional components. The functional components may be the same type of components or they may be different types of components. Each functional component from the third set of functional components has a height (e,g., third height or various different third heights) that is equal or less than a third height threshold value. Moreover, each component from the third set of functional components may have a height that is higher than the second height threshold value. The third set of functional components may include functional components active or passive functional components), such as a capacitor, an inductor, a die, a resistor, a fuse, and a filter.

After providing (at 1306) the second package substrate, the method couples (at 1308) the second package substrate to the PCB, where the second package substrate is adjacent to the fourth component. The second step of FIG. 14 illustrates a second package substrate 1206 coupled to a PCB 1202. As shown in the second step of FIG. 14, the package substrate 1206 is adjacent to the fourth functional component 1218, in addition, the package substrate 1206 includes a second functional component 1212 (e.g., die) on a second area on the second package substrate and a third functional component 1214 (e.g., capacitor) on the third area of the second package substrate. The second component 1212 has a height that is less or equal to a second height threshold value. The third component 1214 has a height that is less or equal to a third height threshold value.

The method then couples (at 1310) the first package substrate to the second package substrate such that the first area of the first package substrate vertically overlaps with the second area of the second package substrate, leaving the third area of the second package substrate free of vertical overlap with the first package substrate. In addition, the first package substrate is coupled to the second package substrate such that the fourth area of the first package substrate vertically overlaps with the fourth component on the PCB, but is otherwise free of vertical overlap with the second package substrate.

The third step of FIG. 14 illustrates a first package substrate coupled to a second package substrate. As shown in the third step of FIG. 14, a first package substrate 1204 that includes several first functional components (e.g., functional component 1208 and die 1210) is coupled to the second package substrate 1206. The first functional components (e.g., components 1208-1210) are placed over a first area of the first package substrate 1204. The fist functional components may also be placed on the fourth area. As shown in FIG. 14, the first functional components may have different shapes and heights. The height of each first functional component is less than a first height threshold value and less than a third height threshold value e.g., less than the height of third functional component 1214) in some implementations. The fourth area of the fist package substrate 1204 vertically overlaps with the fourth component 1218 on the PCB 1202. However, the fourth area of the first package substrate is free of vertical overlap with the second package substrate.

As farther shown in FIG. 14, the first functional components (e.g., components 1208-1210) on the first package substrate 1204, vertically overlaps with the second functional component 1212 (e.g., die) on the second package substrate 1206. However, the first package substrate 1204 is coupled to the second package substrate 1206 so that the first package substrate 1204 and the first functional components do not vertically overlap with the third functional component 1214. Thus, when the first package substrate 1204 is coupled to the second package substrate 1206, the first area of the first package substrate 1204 vertically overlaps with the second area of the second package substrate 1206, while leaving the third area (which includes a third component 1214) of the second package substrate free of vertical overlap with the first package substrate 1204.

It should be noted that the positioning of the functional components on the substrate may include electrically coupling the functional components to the substrate. Different implementations may electrically couple the components to the substrate differently. Examples of methods of coupling components to a substrate include reflow bonding and thermal compression bonding.

In the above description, the height of the functional components is taken into account in order to determine where to place the functional component. In some implementations, the height of the substrate may also be taken into account when determining how to position functional components on a package substrate.

Exemplary Electronic Devices

Figure 15:
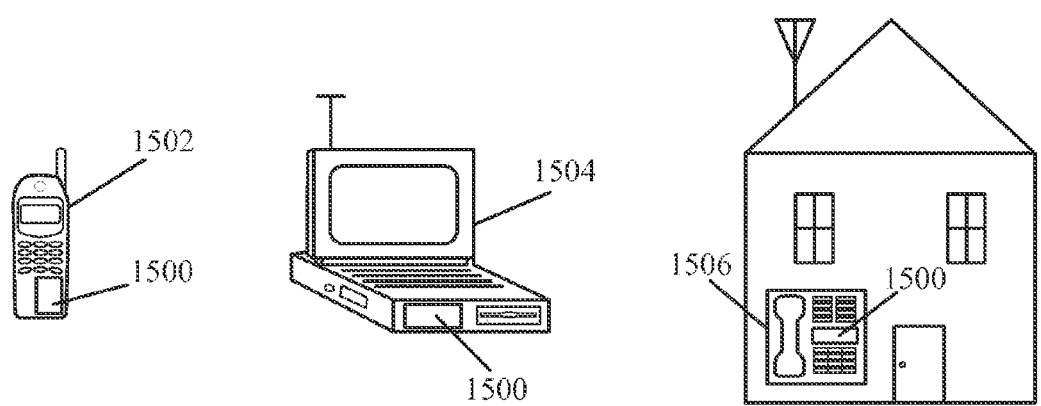
FIG. 15 illustrates various electronic devices that may integrate an integrated circuit and/or hybrid semiconductor module structure described herein.

FIG. 15 illustrates various electronic devices that may be integrated with any of the aforementioned integrated circuit, die or package. For example, a mobile telephone 1502, a laptop computer 1504, and a fixed location terminal 1506 may include an integrated circuit (IC) 1500 as described herein. The IC 1500 may be, for example, any of the integrated circuits, dice or packages described herein. The devices 1502. 1504, 1506 illustrated in FIG. 15 are merely exemplary. Other electronic devices may also feature the IC 1500 including, but not limited to, mobile devices, band-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14 and/or 15 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to he construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and Object B touches object C, then objects A and C may still be considered coupled to one another even if they do not directly physically touch each other. For instance, a first die may be coupled to a second die in a package even though the first die is never directly physically in contact with the second die.

The terms "wafer" and "substrate" may be used herein to include any structure having an exposed surface with which to form an integrated circuit (IC) according to aspects of the present disclosure. The term "die" may be used herein to include an IC. A die may include one or more circuits. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs.

The various features described herein can be implemented in different systems. It should be noted that the foregoing embodiments are merely examples and are not to be construed as limiting. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A structure comprising:
a first package substrate having a first area;
a first component positioned on the first area of the first package substrate, the first component having a first height;
a second package substrate coupled to the first package substrate, the second package substrate having a second area and a third area, the second area of the second package substrate vertically overlapping with the first area of the first package substrate, the third area of the second package substrate non-overlapping with the first area of the first package substrate;
a second component positioned on the second area of the second package substrate, the second component having a second height; and
a third component positioned on the third area of the second package substrate, the third component having a third height that is greater than each of the first and second heights.

2. The structure of claim 1, wherein the first package substrate further comprises a fourth area; the fourth area of the first package substrate non-overlapping with the second and third areas of the second package substrate.

3. The structure of claim 2, further comprising a printed circuit board (PCB) and a fourth component on the PCB, the fourth component having a fourth height, the second package substrate being coupled to the PCB such that the fourth component vertically overlaps with the fourth area of the first package substrate.

4. The structure of claim 3, wherein the fourth height is greater than the second height.

5. The structure of claim 1, wherein the first package substrate is positioned on top of the second package substrate.

6. The structure of claim 1, wherein the first area is the entire area of the first package substrate.

7. The structure of claim 1, wherein at least one of the first, second and third components is an active functional component configured to perform operations.

8. The structure of claim 1, wherein at least one of the first, second and third components is a passive functional component configured to provide a function that is more than providing an electrical path.

9. The structure of claim 1, wherein at least one of the first, second and third components is one of at least a die, a capacitor, an inductor, a resistor, a fuse and/or a filter.

10. The structure of claim 1, wherein the first package substrate is coupled to the second package substrate by a set of solder balls.

11. The structure of claim 1, wherein the structure is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

12. The structure of claim 1, wherein the first package substrate further comprises a fourth area; the fourth area of the first package substrate non-overlapping with the second and third areas of the second package substrate.

13. The structure of claim 12, further comprising a printed circuit board (PCB) and a fourth component on the PCB, the fourth component having a fourth height, the second package substrate being coupled to the PCB such that the fourth component vertically overlaps with the fourth area of the first package substrate.

14. The structure of claim 13, wherein the fourth height is greater than the second height.

15. A method for manufacturing a structure, comprising:
providing a first package substrate including a first area and a first component positioned on the first area of the first package substrate, the first component having a first height;
providing a second package substrate including a second area, a third area, a second component and a third component, the second component positioned on the second area of the second package substrate, the second component having a second height, the third component positioned on the third area of the second package substrate, the third component having a third height that is greater than each of the first and second heights; and coupling the first package substrate to the second package substrate such that (i) the second area of the second package substrate vertically overlaps with the first area of the first package, and (ii) the third area of the second package substrate is non-overlapping with the first area of the first package substrate.

16. The method of claim 15, wherein the first package substrate further includes a fourth area.

17. The method of claim 16, further comprising:
providing a printed circuit board (PCB) having a fourth component, the fourth component having a fourth height; and
coupling the second package substrate to the PCB, such that the fourth area of the first package substrate vertically overlaps with the fourth component on the PCB.

18. The method of claim 17, wherein the fourth height is greater than the second height.

19. The method of claim 15, wherein the first package substrate is positioned on top of the second package substrate.

20. The method of claim 15, wherein the first area is the entire area of the first package substrate.

21. The method of claim 15, wherein at least one of the first, second and third components is an active functional component configured to perform operations.

22. The method of claim 15, wherein at least one of the first, second and third components is a passive functional component configured to provide a function that is more than providing an electrical path.

23. The method of claim 15, wherein at least one of the first, second and third components is one of at least a die, a capacitor, an inductor, a resistor, a fuse and/or a filter.

24. The method of claim 15, wherein the first package substrate is coupled to the second package substrate by a set of solder balls.

25. An apparatus for manufacturing a structure, comprising:
means for providing a first package substrate having a first area and a first component positioned on the first area of the first package substrate, the first component having a first height;
means for providing a second package substrate having a second area and a third area, a second component and a third component, the second component positioned on the second area of the second package substrate, the second component having a second height, the third component positioned on the third area of the second package substrate, the third component having a third height that is greater than each of the first and second heights; and
means for coupling the first package substrate to the second package substrate such that (i) the second area of the second package substrate vertically overlaps with the first area of the first package, and (ii) the third area of the second package substrate is non-overlapping with the first area of the first package substrate.

26. The apparatus of claim 25, wherein the first package substrate further includes a fourth area.

27. The apparatus of claim 26, further comprising:
means for providing a printed circuit board (PCB) having a fourth component, the fourth component having a fourth height; and
means for coupling the second package substrate to the PCB, such that the fourth area of the first package substrate vertically overlaps with the fourth component on the PCB.

28. The apparatus of claim 25, wherein at least one of the first, second and third components is an active functional component configured to perform operations.

29. The apparatus of claim 25, wherein at least one of the first, second and third components is a passive functional component configured to provide a function that is more than providing an electrical path.

30. A structure comprising:
a first package substrate having a first area;
a first component positioned on the first area of the first package substrate, the first component having a first height;
a second package substrate coupled to the first package substrate, the second package substrate having a second area and a third area, the second area of the second package substrate vertically overlapping with the first area of the first package substrate, the third area of the second package substrate non-overlapping with the first area of the first package substrate;
a second component positioned on the second area of the second package substrate, the second component having a second height; and
a third component positioned on the third area of the second package substrate, the third component having a third height that is greater than each of the first and second heights; and
wherein at least one of the first, second and third components is an active functional component that performs operations, and at least one other of the first, second and third components is a passive functional component that provides a function that is more than providing an electrical path.

* * * * *